US012014762B2

(12) United States Patent
Mishra et al.

(10) Patent No.: US 12,014,762 B2
(45) Date of Patent: Jun. 18, 2024

(54) SEMICONDUCTOR MEMORY DEVICE WITH SPIN-ORBIT COUPLING CHANNEL

(71) Applicant: SAMSUNG ELECTRONICS CO., LTD., Suwon-si (KR)

(72) Inventors: Rahul Mishra, Singapore (SG); Hyunsoo Yang, Singapore (SG); Ung Hwan Pi, Hwaseong-si (KR)

(73) Assignees: Samsung Electronics Co., Ltd., Suwon-si (KR); National University of Singapore, Singapore (SG)

( * ) Notice: Subject to any disclaimer, the term of this patent is extended or adjusted under 35 U.S.C. 154(b) by 175 days.

(21) Appl. No.: 17/814,057

(22) Filed: Jul. 21, 2022

(65) Prior Publication Data

US 2023/0110711 A1 Apr. 13, 2023

(30) Foreign Application Priority Data

Oct. 12, 2021 (KR) ........................ 10-2021-0135295

(51) Int. Cl.
*G11C 11/16* (2006.01)
*H10B 61/00* (2023.01)
(Continued)

(52) U.S. Cl.
CPC ........ *G11C 11/1675* (2013.01); *G11C 11/161* (2013.01); *G11C 11/1673* (2013.01);
(Continued)

(58) Field of Classification Search
CPC ............ G11C 11/1675; G11C 11/1673; G11C 11/161; G11C 11/1655; G11C 11/1657;
(Continued)

(56) References Cited

U.S. PATENT DOCUMENTS 9,830,968 B2 11/2017 Shimomura et al.
10,205,088 B2 2/2019 Sasaki et al.
(Continued)

OTHER PUBLICATIONS

Ahmed, K. A., et al., "Area Efficient Multi Level Cell SOT-MRAM with Shared Diode for High Density Memories Applications", 2018 IEEE International Magnetics Conference (INTERMAG), Singapore, Apr. 23, 2018, 2 pp.

(Continued)

*Primary Examiner* — Donald H B Braswell
(74) *Attorney, Agent, or Firm* — Myers Bigel, P.A.

(57) ABSTRACT

A semiconductor memory device may be provided. The semiconductor memory device may include data storage patterns having respective first sides and respective second sides, a spin-orbit coupling (SOC) channel layer in common contact with the first sides of the data storage patterns, the SOC channel layer is configured to provide a spin-orbit torque to the data storage patterns, read access transistors connected between the second sides of respective ones of the data storage patterns and respective data lines, a write access transistor connected between a first end of the SOC channel layer and a source line, and a bit line connected to a second end of the SOC channel layer. Each of the data storage patterns comprises a free layer in contact with the SOC channel layer and an oxygen reservoir layer in contact with the free layer.

10 Claims, 10 Drawing Sheets

(51) Int. Cl.

| | |
|---|---|
| ***H10N 50/10*** | (2023.01) |
| ***H10N 50/80*** | (2023.01) |
| ***H10N 50/85*** | (2023.01) |
| ***H10N 52/80*** | (2023.01) |
| ***H10N 52/85*** | (2023.01) |

(52) U.S. Cl.
CPC ............ *H10B 61/20* (2023.02); *H10N 50/10* (2023.02); *H10N 50/80* (2023.02); *H10N 50/85* (2023.02); *H10N 52/80* (2023.02); *H10N 52/85* (2023.02); *G11C 11/1655* (2013.01)

(58) Field of Classification Search
CPC ..... G11C 11/1659; G11C 11/18; H10B 61/20; H10B 61/22; H10B 61/00; H10N 50/10; H10N 50/80; H10N 50/85; H10N 52/80; H10N 52/85
See application file for complete search history.

(56) References Cited

U.S. PATENT DOCUMENTS

| | | | |
|---|---|---|---|
| 10,360,963 | B2 | 7/2019 | Park et al. |
| 11,004,490 | B2 | 5/2021 | Sakhare et al. |
| 2020/0202914 | A1* | 6/2020 | Sakhare .............. G11C 11/1673 |
| 2020/0235289 | A1* | 7/2020 | Alam .................... G11C 11/161 |
| 2020/0350364 | A1 | 11/2020 | Wan et al. |
| 2021/0066580 | A1 | 3/2021 | Song et al. |
| 2021/0134339 | A1* | 5/2021 | Song ...................... H10N 50/85 |
| 2022/0149268 | A1* | 5/2022 | Park .................... G11C 11/1675 |

OTHER PUBLICATIONS

Ali, Karim, et al., "Area Efficient Multi-Bit per Cell Architecture for SOT-MRAM with Dedicated Diodes for High Density MRAM", IEEE Magnetics Letters, vol. 9, Apr. 20, 2018, 5 pp.

Kim, Yusung, et al., "Multilevel Spin-Orbit Torque MRAMs", IEEE Transactions on Electron Devices, vol. 62, Issue 2, Feb. 2015, pp. 561-568.

Mahfouzi, Farzad, et al., "Microscopic origin of spin-orbit torque in ferromagnetic heterostructures: A first-principles approach", Physical Review B, vol. 101, Issue 6, Feb. 18, 2020, pp. 060405-1-060405-6.

Manchon, A., et al., "Current-induced spin-orbit torques in ferromagnetic and antiferromagnetic systems", Review of Modern Physics, vol. 91, Jul.-Sep. 2019, pp. 035004-1-035004-80.

Mishra, Rahul, et al., "Shared-Write-Channel-Based Device for High-Density Spin-Orbit-Torque Magnetic Random-Access Memory", Physical Review Applied, vol. 15, Issue 2, Feb. 25, 2021, pp. 024063-1-024063-9.

Seo, Yeongkyo, et al., "Area-Efficient SOT-MRAM with a Schottky Diode", IEEE Electron Device Letters, vol. 37, Issue 8, Aug. 2016, pp. 982-985.

Tan, Aik Jun, et al., "Magneto-ionic control of magnetism using a solid-state proton pump", Nature Materials, Jan. 2019, pp. 35-41.

* cited by examiner

SEMICONDUCTOR MEMORY DEVICE WITH SPIN-ORBIT COUPLING CHANNEL

CROSS-REFERENCE TO RELATED APPLICATIONS

This U.S. non-provisional patent application claims priority under 35 U.S.C. § 119 to Korean Patent Application No. 10-2021-0135295, filed on Oct. 12, 2021, in the Korean Intellectual Property Office, the entire contents of which are hereby incorporated by reference.

BACKGROUND

The present disclosure relates to a semiconductor memory device, and in particular, to a semiconductor memory device with improved electric characteristics and a method of fabricating the same.

As the demand for electronic devices having increased speed and/or reduced power consumption characteristics increases, the demand for semiconductor memory devices with faster operating speeds and/or lower operating voltages is increasing. Magnetic memory devices have been proposed to satisfy such a demand. The magnetic memory device has technical advantages, such as reduced latency and/or non-volatility, and thus, it is emerging as a next-generation semiconductor memory device. Accordingly, various studies are being conducted to develop a magnetic memory device with high integration density and/or low power consumption.

SUMMARY

Embodiments of the inventive concept provide a highly-integrated semiconductor memory device that is operated using a spin-orbit torque.

According to some embodiments of the inventive concept, a semiconductor memory device may include data storage patterns having respective first sides and respective second sides, a spin-orbit coupling (SOC) channel layer in common contact with the first sides of the data storage patterns, the SOC channel layer is configured to provide a spin-orbit torque to the data storage patterns, read access transistors connected between the second sides of respective ones of the data storage patterns and respective data lines, a write access transistor connected between a first end of the SOC channel layer and a source line, and a bit line connected to a second end of the SOC channel layer. Each of the data storage patterns comprises a free layer in contact with the SOC channel layer and an oxygen reservoir layer in contact with the free layer.

According to some embodiments of the inventive concept, a semiconductor memory device may include a spin-orbit coupling (SOC) channel layer, a plurality of data storage patterns on the SOC channel layer, each of the data storage patterns including a free layer in contact with the SOC channel layer, a fixed layer on the free layer, an oxygen reservoir layer between the free layer and the fixed layer, a first TMR enhancement layer between the free layer and the oxygen reservoir layer, and a second TMR enhancement layer between the oxygen reservoir layer and the fixed layer, a write access transistor connected between a first end of the SOC channel layer and a source line, and read access transistors respectively connected between respective ones of the fixed layers of the data storage patterns and respective data lines. The SOC channel layer may be configured to provide a spin-orbit torque to the data storage patterns. Each of the data storage patterns may be configured such that an amount of oxygen in an interface region between the free layer and the SOC channel layer is adjusted by a voltage applied thereto.

According to some embodiments of the inventive concept, a semiconductor memory device may include a bit line and a source line, a plurality of sub-arrays, which are respectively connected between the bit line and the source line, each of the sub-arrays including a plurality of data storage devices, a plurality of read access transistors connected to the data storage devices, a SOC channel layer connected in common to the data storage devices, and a write access transistor connected to a first end of the SOC channel layer, write word lines in respective ones of the sub-arrays, each of the write word lines is connected to a gate electrode of the write access transistor of a respective one of the sub-arrays, read word lines in respective ones of the sub-arrays, each of the read word lines of a respective sub-array is connected in common to gate electrodes of the read access transistors of the respective sub-array, and data lines connected to one of the read access transistors of each of the plurality of sub-arrays of the semiconductor memory device. Each of the data storage devices may include a free layer in contact with the SOC channel layer and an oxygen reservoir layer on the free layer.

DETAILED DESCRIPTION

Example embodiments of the inventive concepts will now be described more fully with reference to the accompanying drawings, in which example embodiments are shown.

Figure 1:
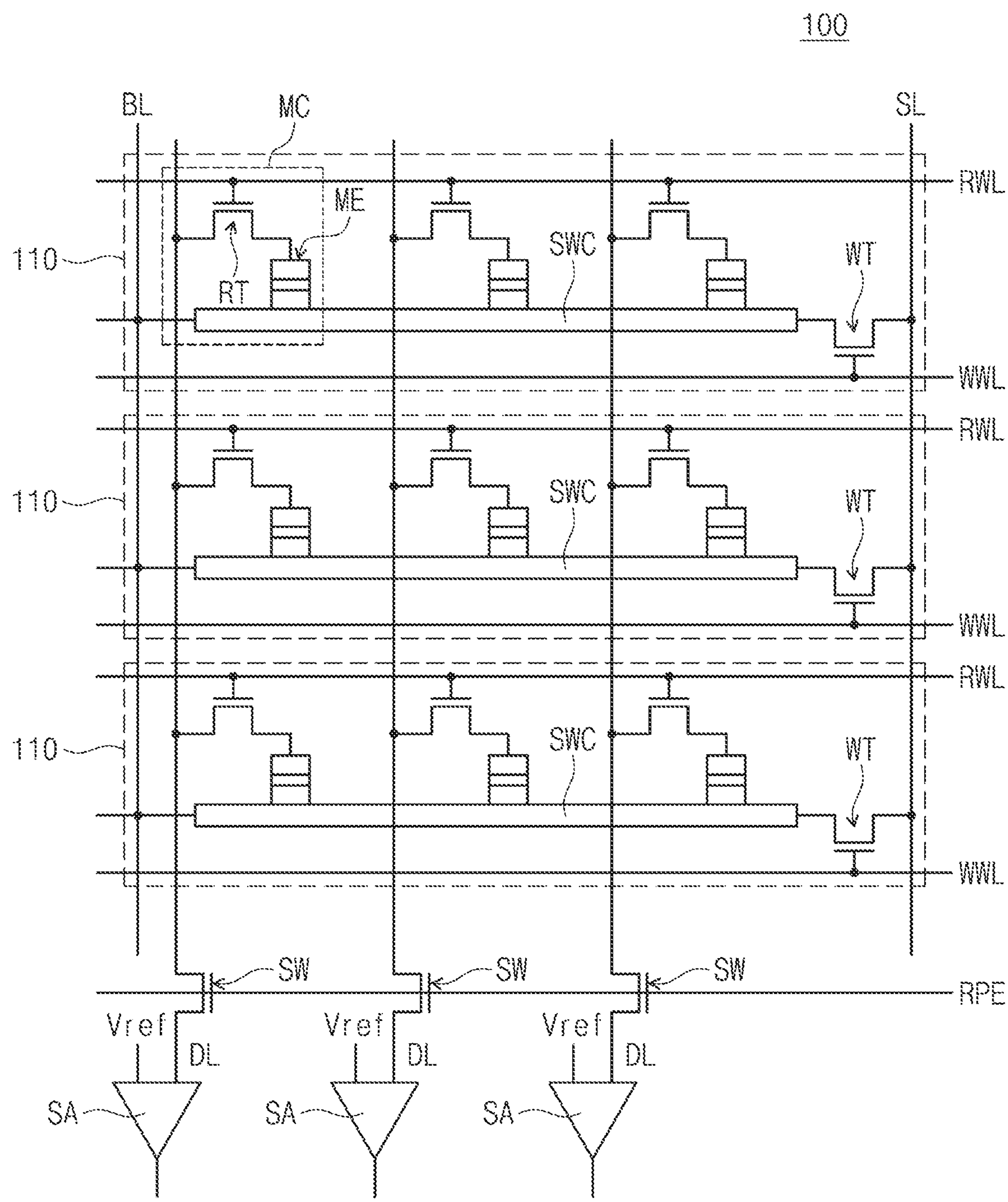
FIG. 1 is a circuit diagram illustrating a cell array of a semiconductor memory device according to some embodiments of the inventive concept.
Figure 2:
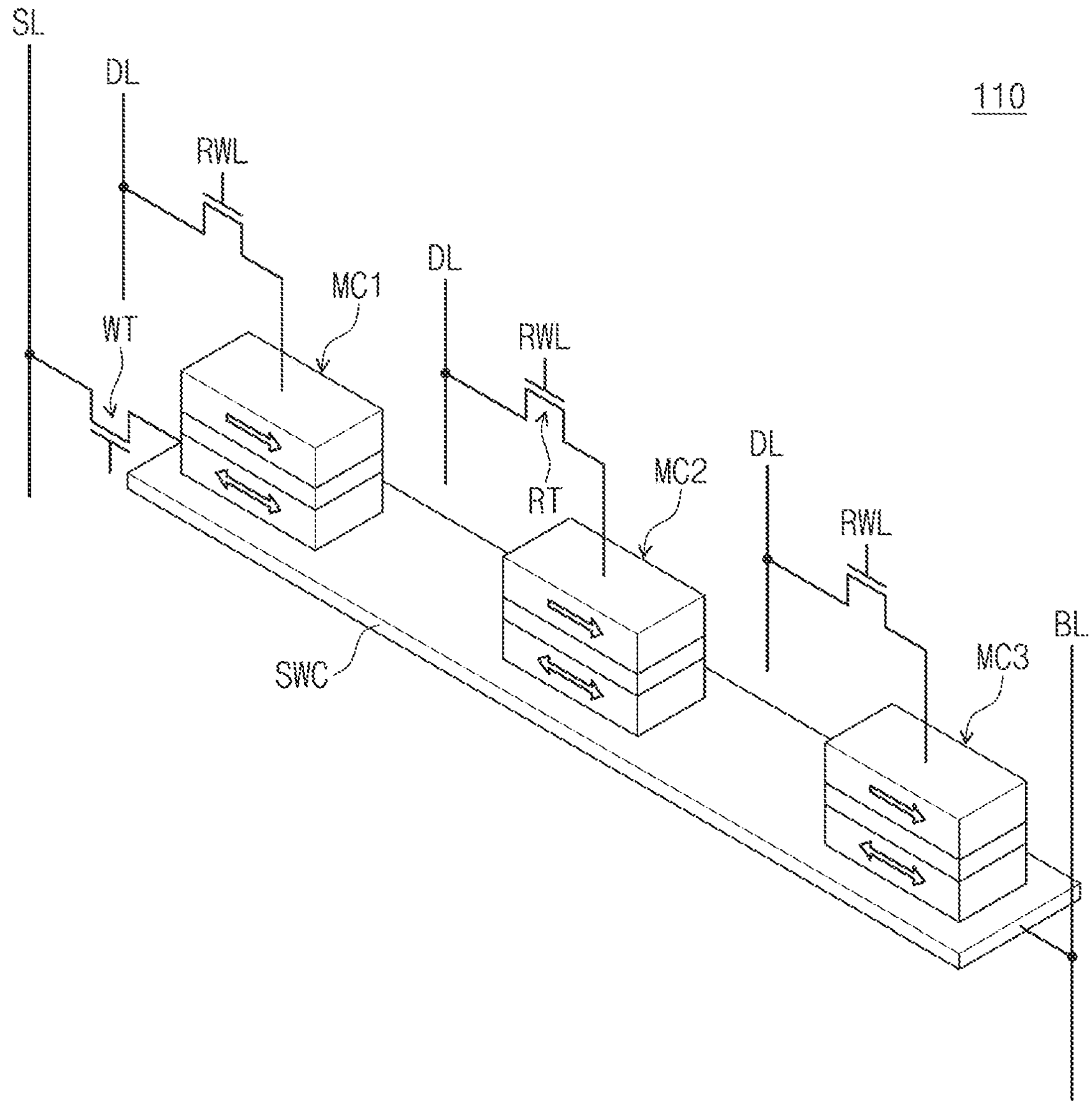
FIG. 2 is a diagram illustrating one sub-array in a cell array of a semiconductor memory device according to some embodiments of the inventive concept.
Figure 3:
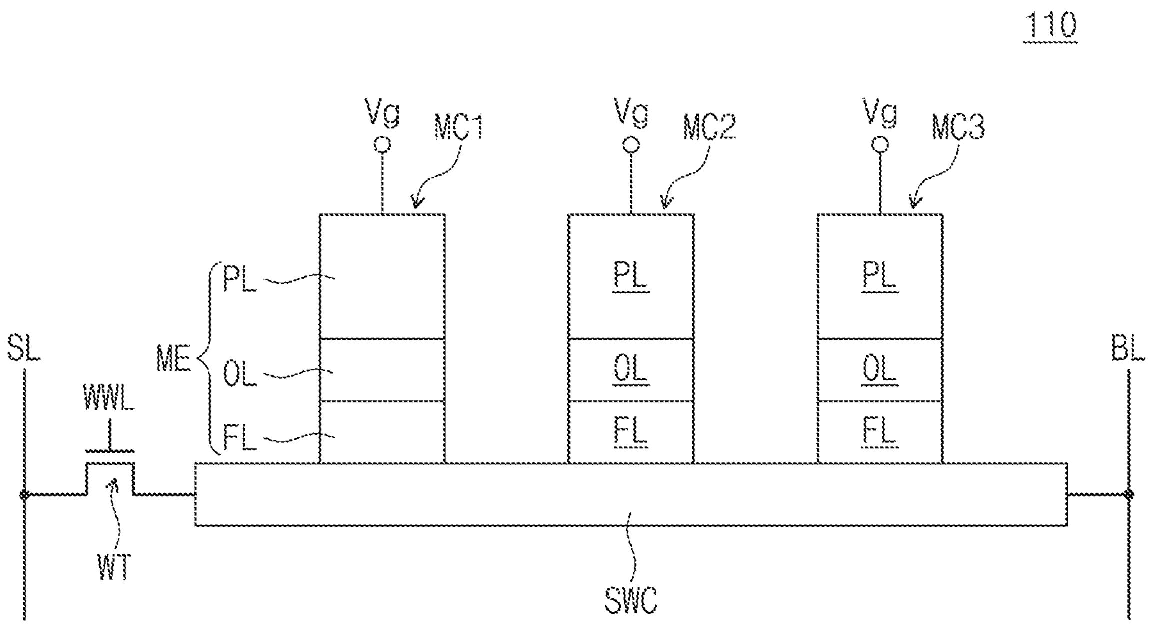
FIG. 3 is a sectional view illustrating one sub-array in a cell array of a semiconductor memory device according to some embodiments of the inventive concept.

FIG. 1 is a circuit diagram illustrating a cell array of a semiconductor memory device according to some embodiments of the inventive concept. FIG. 2 is a diagram illustrating one sub-array in a cell array of a semiconductor memory device according to some embodiments of the inventive concept. FIG. 3 is a sectional view illustrating one sub-array in a cell array of a semiconductor memory device according to some embodiments of the inventive concept.

Referring to FIGS. 1, 2, and 3, a memory cell array 100 may include a plurality of sub-arrays 110. The sub-arrays 110 may be connected to a bit line BL and a source line SL which are paired.

Each of the sub-arrays 110 may be connected to one write word line WWL and one read word line RWL. Each of the sub-arrays 110 may include a plurality of memory cells MC, which are arranged in a row direction, a spin-orbit coupling (SOC) channel layer SWC, which is connected in common to the memory cells MC, and one write access transistor WT. As used herein, the term “connected” may refer to elements that are electrically and/or physically connected. Referring to FIGS. 2 and 3, each sub-array 110 may include first, second, and third memory cells MC1, MC2, and MC3. Each of the memory cells MC may include a data storage device or data storage pattern ME and a read access transistor RT.

In some embodiments, the data storage devices ME in each sub-array 110 may share a single SOC channel layer SWC. Thus, each of the memory cells MC may require dynamically programmable devices, in which a direction of spin accumulation (e.g., SOT polarity) can be modified during a data writing operation. That is, there is a need for an element capable of selectively programming the memory cells MC of each sub-array 110 during supplying of a current to the SOC channel layer SWC in a specific direction. Accordingly, each memory cell MC may include an oxygen reservoir layer OL, and in this case, a data programming operation on each memory cell MC may be achieved using an electric field driven oxygen migration and a spin-orbit torque (SOT) polarity modulation, which are caused by a voltage or electric field applied to the oxygen reservoir layer OL.

The write access transistor WT may include a gate electrode, which is connected to the write word line WWL, a source electrode, which is connected to the source line SL, and a drain electrode, which is connected to the SOC channel layer SWC.

The read access transistors RT of the memory cells MC may be connected to data lines DL, respectively. Each of the data lines DL may be connected to a sense amplifier SA through a drive transistor SW, and in this case, a data stored in the memory cell MC may be output by comparing a sensing voltage of the data line DL with a reference voltage.

The read access transistor RT may include a gate electrode, which is connected to the read word line RWL, a drain electrode, which is connected to the data line DL, and a source electrode, which is connected to the data storage device ME.

The data storage device ME may include a free layer FL, a fixed layer PL, and the oxygen reservoir layer OL therebetween.

The free layer FL may have a magnetization direction that can be changed by the SOT. The free layer FL may exhibit a perpendicular magnetic anisotropy. In some embodiments, the free layer FL may have a single-layered structure or a multi-layered structure. The free layer FL may be formed of or include at least one of magnetic materials (e.g., iron (Fe), cobalt (Co), nickel (Ni), boron (B), silicon (Si), platinum (Pt), palladium (Pd), and/or alloys thereof). The free layer FL may be formed of or include at least one of intrinsic perpendicular magnetic materials and/or extrinsic perpendicular magnetic materials. The intrinsic perpendicular magnetic material may include a material exhibiting a perpendicular magnetization property, even when there is no external cause. The extrinsic perpendicular magnetic material may include a material, which exhibits an intrinsic in-plane magnetization property when there is no external cause but exhibits a perpendicular magnetization property by an external cause. The free layer FL may have a thickness of about 0.5 nm to 1 nm. For example, the free layer FL may be an about 0.9 nm thick cobalt layer. In some embodiments, the free layer FL may be formed of or include $Co_{60}Fe_{20}B_{20}$.

The PL may have a magnetization direction, which is fixed to a specific direction, and may have a perpendicular magnetic anisotropy. The fixed layer PL may have a synthetic anti-ferromagnetic (SAF) structure. The fixed layer PL may include a first pinned pattern, a second pinned pattern, and an exchange coupling pattern between the first and second pinned patterns. The first pinned pattern may be formed of or include a magnetic material, and a magnetization direction of the first pinned pattern may be fixed by the second pinned pattern. The first pinned pattern and the second pinned pattern may be coupled to each other in an anti-parallel manner by the exchange coupling pattern. In some embodiments, the fixed layer PL may be formed of or include at least one of Co, Al, Ir, Ru, Pt, Ta, or Hf. In some embodiments, the fixed layer PL may be formed of or include at least one of Ni, Fe, Co, B, Ge, Mn, and/or alloys of Ni, Fe, Co, B, Ge, or Mn. In some embodiments, the fixed layer PL may be formed of or include compounds or mixtures (e.g., NiFe, CoFe, or CoFeB) containing the above elements. In some embodiments, the fixed layer PL may include one of Co/Pt, Co/Pd, or Co/Ni super lattices.

The oxygen reservoir layer OL may be an oxygen-containing layer and may be formed of or include a material having high mobility of oxygen ions. The oxygen reservoir layer OL may be configured to contain oxygen, and if a voltage or electric field is applied to the oxygen reservoir layer OL, oxygen ions in the oxygen reservoir layer OL may be migrated to an interface between the free layer FL and the SOC channel layer SWC. The speed and efficiency of the oxygen migration may rely on nature and thickness of the oxygen reservoir layer OL (e.g., a gadolinium oxide (GdOx) layer), and an elevated temperature and longer dwell time may be needed to facilitate faster oxygen migration. The oxygen reservoir layer OL may contain a rare-earth element, such as gadolinium (Gd) or terbium (Tb). As an example, the oxygen reservoir layer OL may be a gadolinium oxide (GdOx) layer. The oxygen reservoir layer OL may be thicker than the SOC channel layer SWC or the free layer FL and may have a thickness of about 3 nm to 20 nm in a direction that is perpendicular to the SOC channel layer SWC.

In each of the sub-arrays 110, the memory cells MC may share the SOC channel layer SWC. In other words, the free layers FL of the data storage devices ME of each sub-array 110 may be in contact with one of the SOC channel layers SWC.

The SOC channel layer SWC may be configured to exert a spin-orbit torque on the free layer FL of the data storage device ME. For example, a current may be produced to flow through the SOC channel layer SWC, and in this case, the current may be an in-plane current flowing through the SOC channel layer SWC. The SOC channel layer SWC may be formed of or include at least one of non-magnetic materials (e.g., Pt, Ta, or W). The SOC channel layer SWC may have a thickness of about 1 nm to 3 nm. In some embodiments, the SOC channel layer SWC may be an about 1.5 nm thick platinum layer (Pt).

A first end of the SOC channel layer SWC may be connected to the drain terminal of the write access transistor WT, and a second end of the SOC channel layer SWC may be connected to the bit line BL. The SOC channel layer SWC may be a layer in which the spin-orbit torque is produced, and the magnetization direction of the free layer FL of the data storage device ME may be switched based on a magnitude of the current induced on an in-plane of the SOC channel layer SWC. In some embodiments, the SOC channel layer SWC may be a heavy metal layer or may be formed of or include a material doped with heavy metal.

Figure 4A:
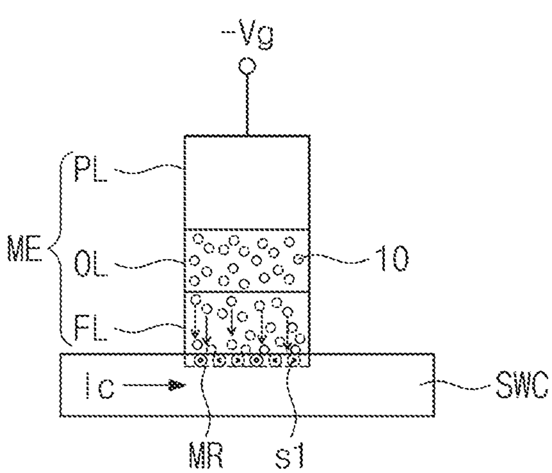
FIGS. 4A and 4B are diagrams which are presented to describe operations on a memory cell according to some embodiments of the inventive concept.
Figure 4B:
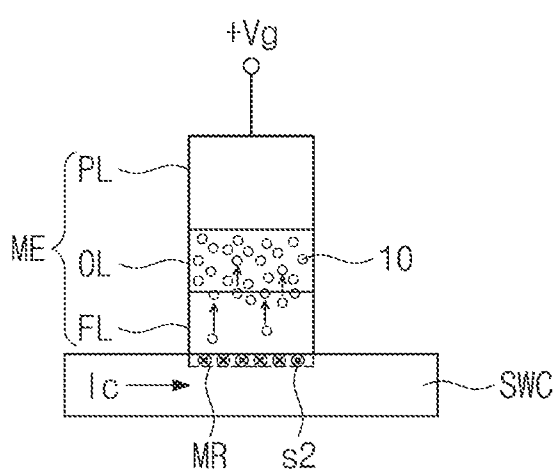

FIGS. 4A and 4B are diagrams which are presented to describe operations on a memory cell according to some embodiments of the inventive concept.

In some embodiments, by using a gate programmable Pt/Co device, each memory cell MC may be configured to serve as a multi-bit cell, in which the polarity of SOT for individual bits can be toggled dynamically.

In detail, referring to FIGS. 4A and 4B, when an in-plane current IC is supplied to the SOC channel layer SWC, an oxygen ion 10 may be moved to an interface region MR, which is formed between the free layer FL and the SOC channel layer SWC, by a voltage or electric field applied to the oxygen reservoir layer OL and may be accumulated in the interface region MR. The spin polarity may be switched depending on an amount of the oxygen 10 in the interface region MR.

An effective spin hall angle may have a positive or negative value, depending on an amount of oxygen at the interface between the free layer FL and the SOC channel layer SWC. An amount of the oxygen ions 10 in the interface region MR between the free layer FL and the SOC channel layer SWC may be adjusted by applying a gate voltage of Vg or −Vg to the oxygen reservoir layer OL to move the oxygen ions 10 to the oxygen reservoir layer OL. That is, for each memory cell MC, it may be possible to change a switching polarity, based on an amount of the oxygen 10 in the interface region MR.

Referring to FIG. 4A, if the fixed layer PL or the oxygen reservoir layer OL is applied with a negative gate voltage of −Vg, a concentration of oxygen ions in the interface region MR between the SOC channel layer SWC and the free layer FL may be increased, and this may allow the interface region MR to have a negative SOT polarity s1. In other words, the applying of the negative gate voltage (−Vg) to the fixed layer PL or the oxygen reservoir layer OL may cause migration of oxygen from the oxygen reservoir layer OL to the free layer FL, and due to the hydrolysis in the SOC channel layer SWC thereunder may cause migration of oxygen toward the free layer FL.

By contrast, referring to FIG. 4B, if the fixed layer PL or the oxygen reservoir layer OL is applied with a positive gate voltage of +Vg, the oxygen 10 in the interface region MR between the SOC channel layer SWC and the free layer FL may be migrated into the oxygen reservoir layer OL, and this may allow the interface region MR to have a positive SOT polarity s2. That is, it may exhibit behavior like a normal Pt-based SOT device.

Figure 5:
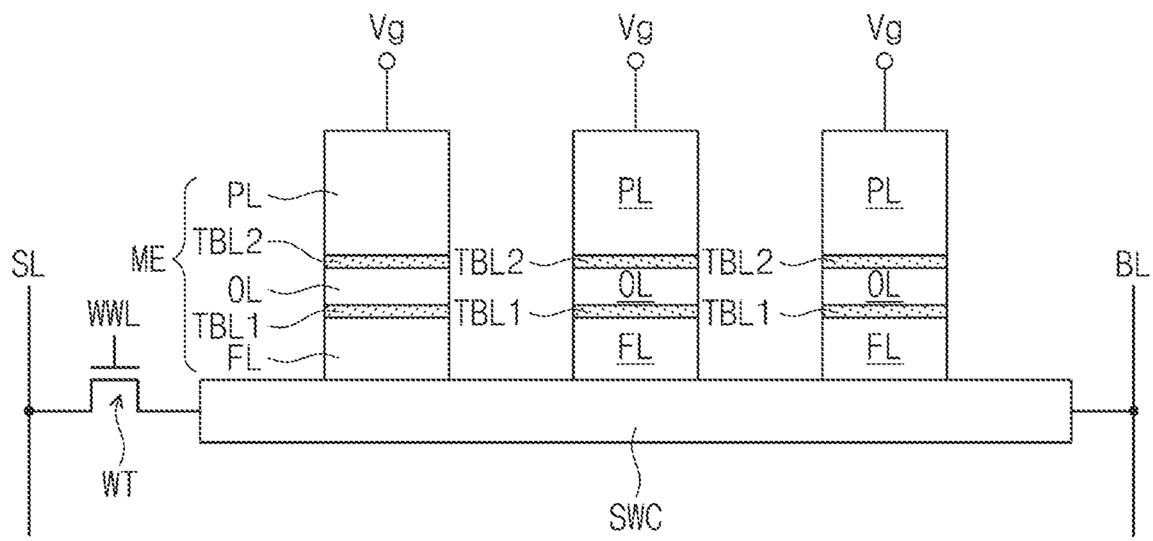
FIGS. 5 and 6 are sectional views illustrating one sub-array in a cell array of a semiconductor memory device according to some embodiments of the inventive concept.
Figure 6:
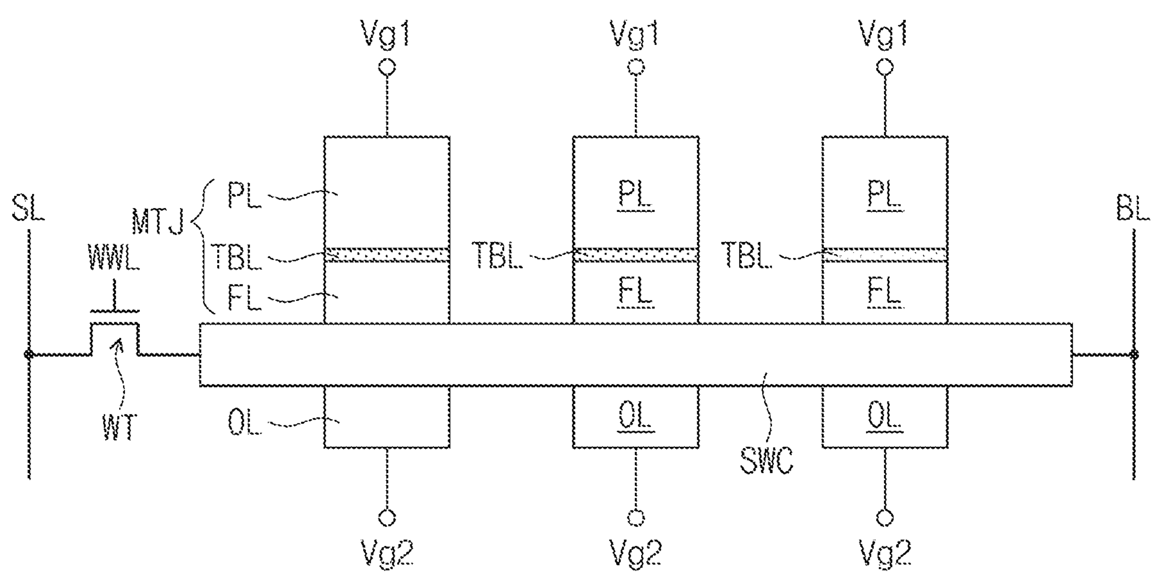

FIGS. 5 and 6 are sectional views, each of which illustrates one sub-array in a cell array of a semiconductor memory device according to some embodiments of the inventive concept. For concise description, a previously-described element may be identified by a similar or identical reference number without repeating an overlapping description thereof.

In the embodiment of FIG. 5, the data storage device ME may further include first and second tunnel barrier layers TBL1 and TBL2, in addition to the free layer FL, the oxygen reservoir layer OL, and the fixed layer PL.

The first and second tunnel barrier layers TBL1 and TBL2 may be configured to enhance a tunnel magnetoresistance (TMR) property. The first and second tunnel barrier layers TBL1 and TBL2 may be formed of or include at least one of magnesium oxide, titanium oxide, aluminum oxide, magnesium-zinc oxide, or magnesium-boron oxide. The first and second tunnel barrier layers TBL1 and TBL2 may each include a tunnel magnetoresistance (TMR) enhancement layer.

The oxygen reservoir layer OL may have a thickness of about 20 nm, and in this case, the gate voltage Vg may be about 2.2V. In some embodiments, the oxygen reservoir layer OL may have a thickness of about 3 nm to 20 nm, and in this case, the gate voltage Vg may be about 6-1.5V. In other words, by using a material appropriate for the oxygen reservoir layer OL and optimizing or controlling a thickness of the oxygen reservoir layer OL, it may be possible to effectively perform a programming operation on the data storage device ME with a voltage of 1V or lower.

In addition, if a TMR-enhancement layer (e.g., MgO) as the first tunnel barrier layer TBL1 is formed at the interface between the free layer FL and the oxygen reservoir layer OL, it may be possible to improve both of ion mobility and TMR properties. In this case, a data reading operation may be performed through a magnetic tunnel junction, and an electrode required for the data storage device ME may be composed of one electrode, which is used to apply a voltage to the fixed layer PL.

In the embodiment of FIG. 6, the SOC channel layer SWC may be disposed between a magnetic tunnel junction pattern MTJ and the oxygen reservoir layer OL. The magnetic tunnel junction pattern MTJ may include the free layer FL, the fixed layer PL, and a tunnel barrier layer TBL therebetween.

In the present embodiment, the memory cell may have an electrode, which is used to apply a voltage to the oxygen reservoir layer OL, and an electrode, which is used to apply a voltage to the magnetic tunnel junction pattern MTJ. That is, during a data reading operation, a first gate voltage Vg1 may be applied to the fixed layer PL, and during a data writing operation, a second gate voltage Vg2 may be directly applied to the oxygen reservoir layer OL. In this case, it may be possible to secure a tunnel magnetoresistance (TMR) property in a more stable manner.

Figure 7A:
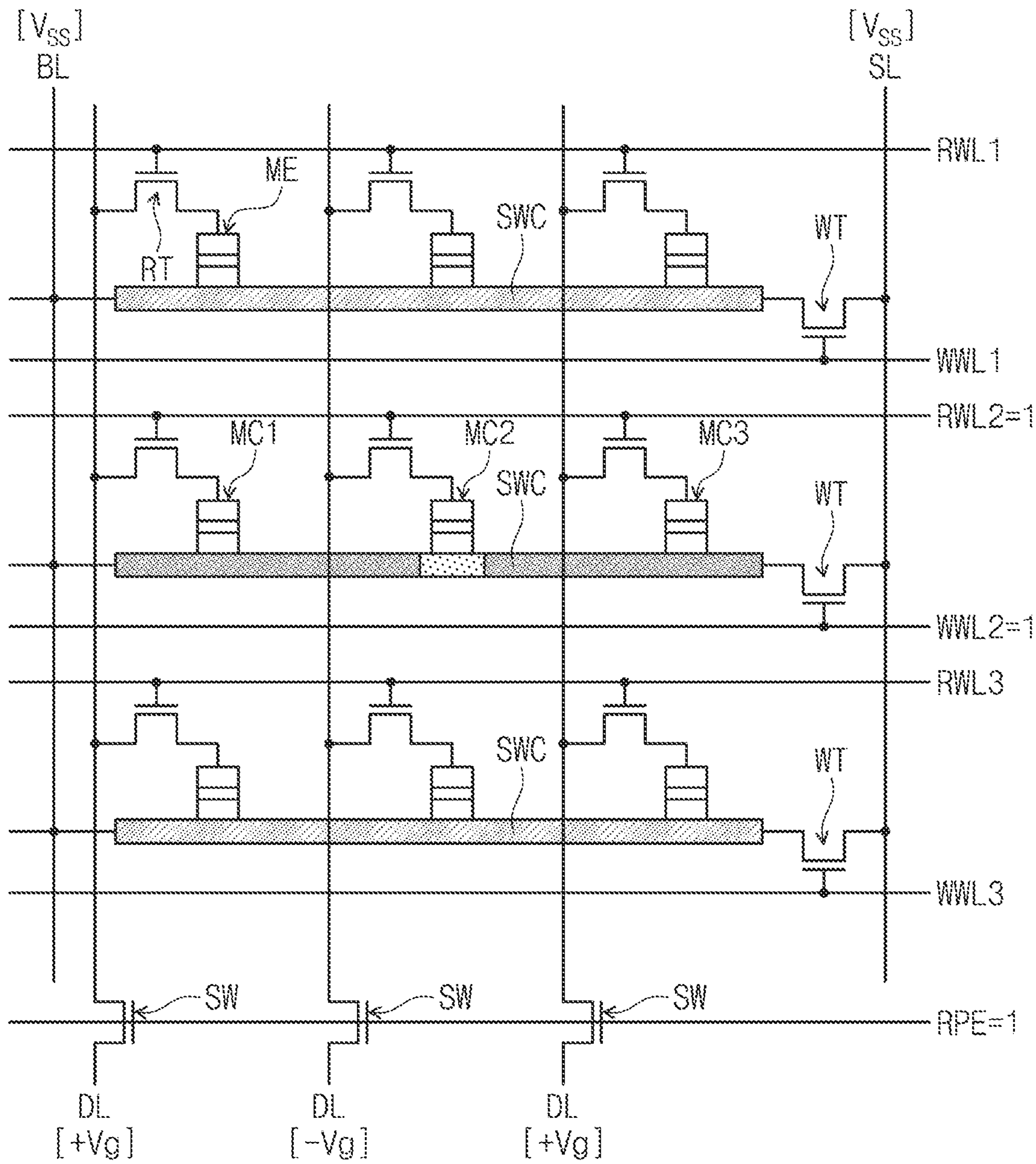
FIGS. 7A and 7B are diagrams illustrating a writing operation on a semiconductor memory device according to some embodiments of the inventive concept.
Figure 7B:
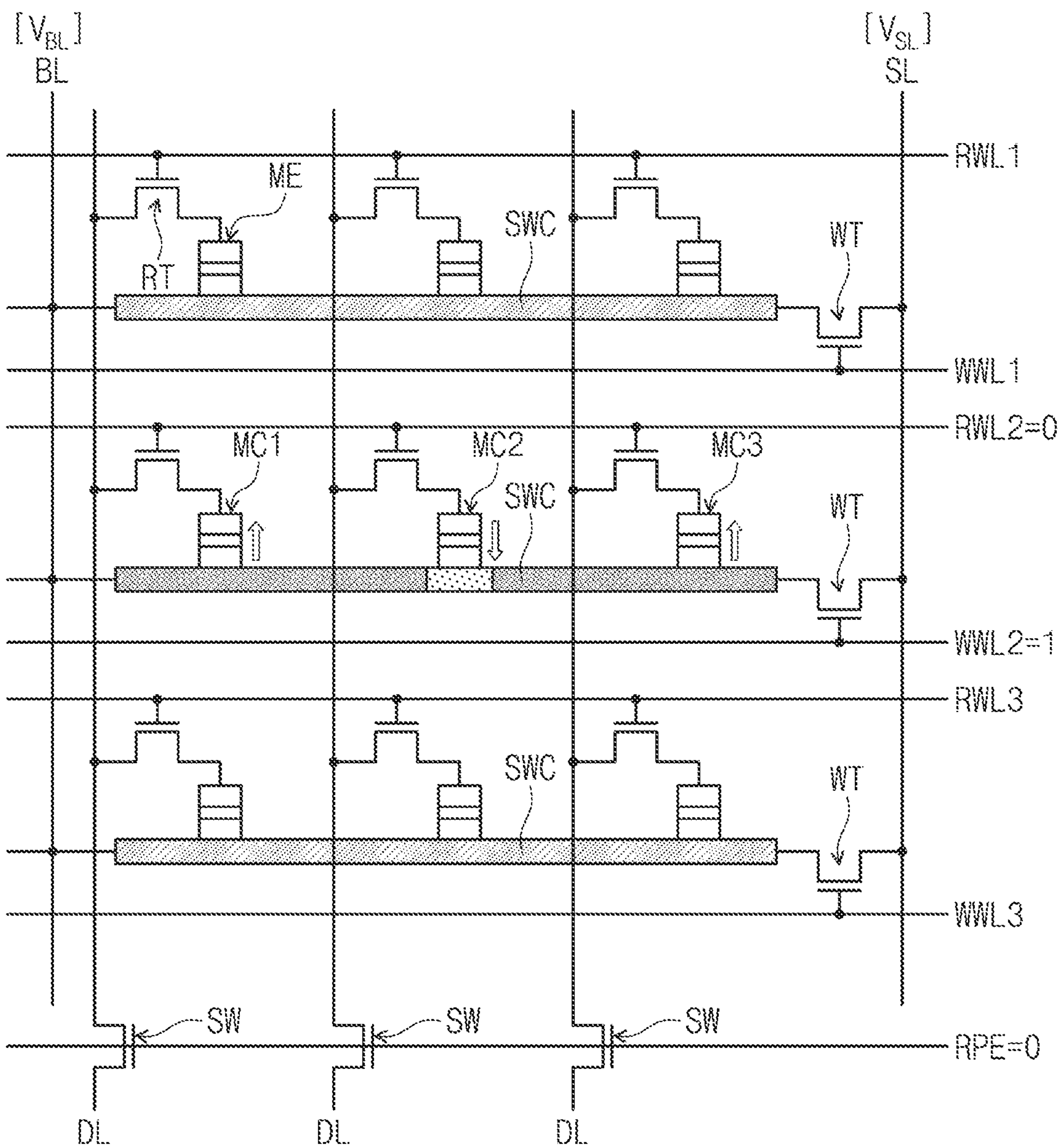
Figure 8:
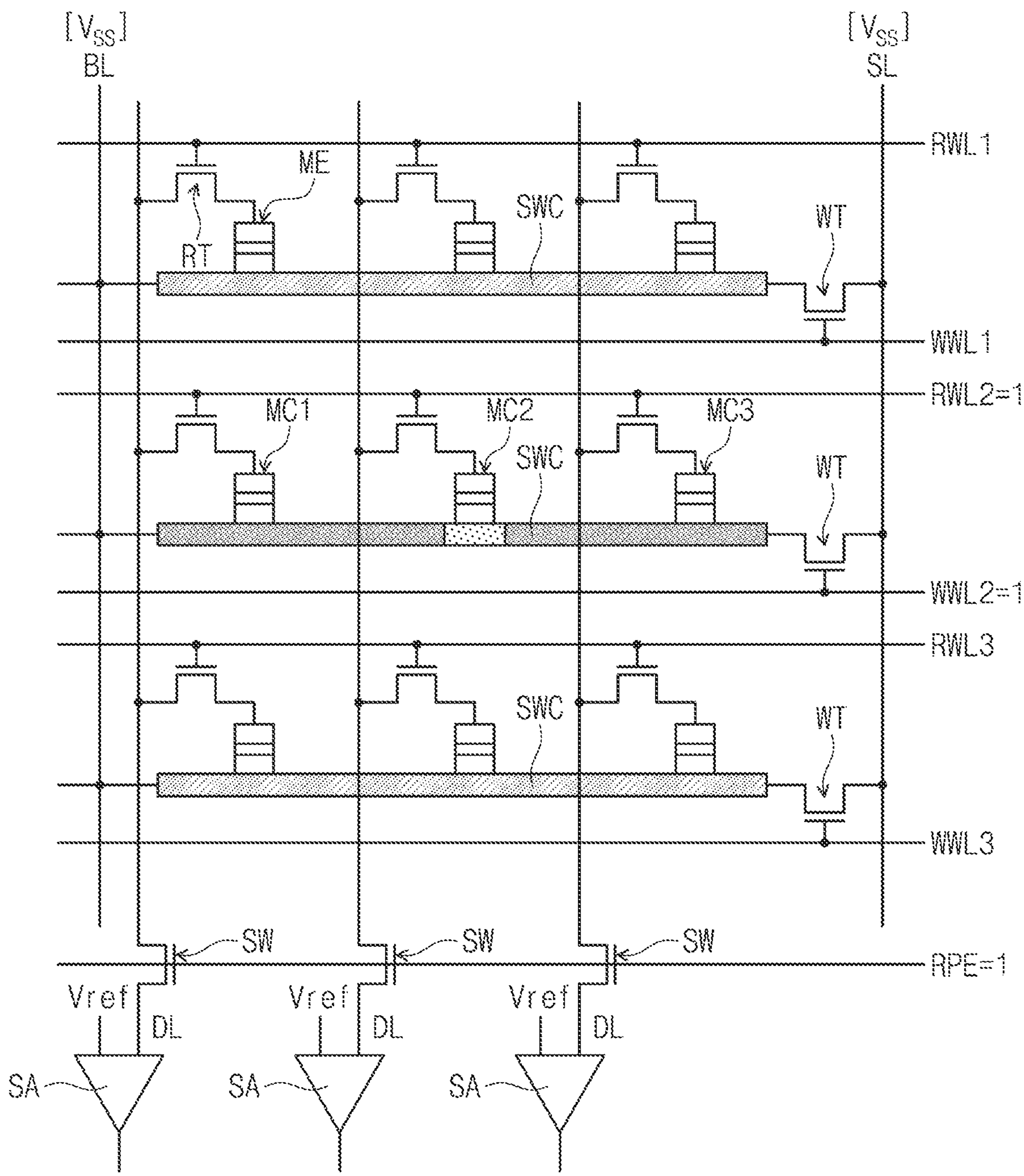
FIG. 8 is a diagram illustrating a reading operation on a semiconductor memory device according to some embodiments of the inventive concept.

FIGS. 7A and 7B are diagrams illustrating a writing operation on a semiconductor memory device according to some embodiments of the inventive concept. FIG. 8 is a diagram illustrating a reading operation on a semiconductor memory device according to some embodiments of the inventive concept.

According to some embodiments of the inventive concept, a sub-array in the second row may be selected, and in this case, the sub-array may include first, second, and third memory cells MC1, MC2, and MC3.

The sub-array including the SOC channel layer SWC may be configured to have the read access transistors RT for reading and programming operations and one write access transistor WT for a data writing operation using a single current pulse. The data writing operation on a memory cell in the selected sub-array may be performed in two steps.

Referring to FIG. 7A, the SOC channel layer SWC below each of the memory cells MC1, MC2, and MC3 may be programmed to a specific SOT polarity corresponding to a desired data state.

To program the SOC channel layer SWC, the write access transistor WT of the selected sub-array may be turned on by enabling a second write word line WWL2. In addition, a control line RPE controlling the drive transistors SW connected to the data lines DL may be controlled to be in an enable state. Here, a negative or positive gate voltage of −Vg or +Vg may be applied to the data storage devices ME by enabling a second read word line RWL2 connected to each of the memory cells MC1, MC2, and MC3. As an example, the positive gate voltage of +Vg may be applied to the first and third memory cells MC1 and MC3, and the negative gate voltage of −Vg may be applied to the second memory cell MC2. In the embodiment shown in FIG. 7A, owing to the positive gate voltage +Vg applied to the data lines DL of the first and third memory cells MC1 and MC3, the first and third memory cells MC1 and MC3 may be programmed to have a negative SOT polarity. By contrast, owing to the positive gate voltage +Vg applied to the data line DL of the second memory cell MC2, the second memory cell MC2 may be programmed to have a positive SOT polarity.

Referring to FIG. 7B, after the programming of each of the memory cells MC1, MC2, and MC3, the write word line WWL may be maintained to the enabled state, and the read word line RWL may be controlled to be in a disabled state, as shown in FIG. 7B. In addition, the control line RPE controlling the drive transistors SW connected to the data lines DL may be controlled to be in a disabled state.

The write access transistor WT may allow a current to flow from the bit line BL on the left to the source line SL on the right. The current flowing through the SOC channel layer SWC may be used to write a desired data in each of the memory cells. A magnetization direction of the second memory cell MC2 may be switched to a down state (i.e., logic “0”), whereas magnetization directions of other memory cells (e.g., MC1 and MC3) may be switched to an up direction (i.e., logic “1”). Accordingly, the sub-array of the selected row may be written to store data “101” when the writing operation is finished.

To store data “110” in the sub-array of the selected row, the negative gate voltage of −Vg may be applied to the data line DL of the third memory cell MC3, without a change in direction of the wire current. Here, the positive gate voltage of +Vg may be applied to the data lines DL of the first and second memory cells MC1 and MC2.

In some embodiments, due to a unidirectional writing property of the SOC channel layer SWC, it may be possible to omit a current polarity changing circuit, which may be needed in the conventional SOT memory device or the spin-transfer torque (STT) memory device, and thereby to increase an integration density of a semiconductor memory device.

Referring to FIG. 8, in a reading operation of the semiconductor memory device according to some embodiments of the inventive concept, while both of the write and read word lines WWL2 and RWL2 of the selected sub-array are controlled to be in an enabled state, sensing voltages of the data lines DL connected to the first, second, and third memory cells MC1, MC2, and MC3 may be output to the sense amplifiers SA. Resistance states (i.e., stored data) of the first, second, and third memory cells MC1, MC2, and MC3 may be determined based on voltage or current values obtained through the data lines DL.

Figure 9:
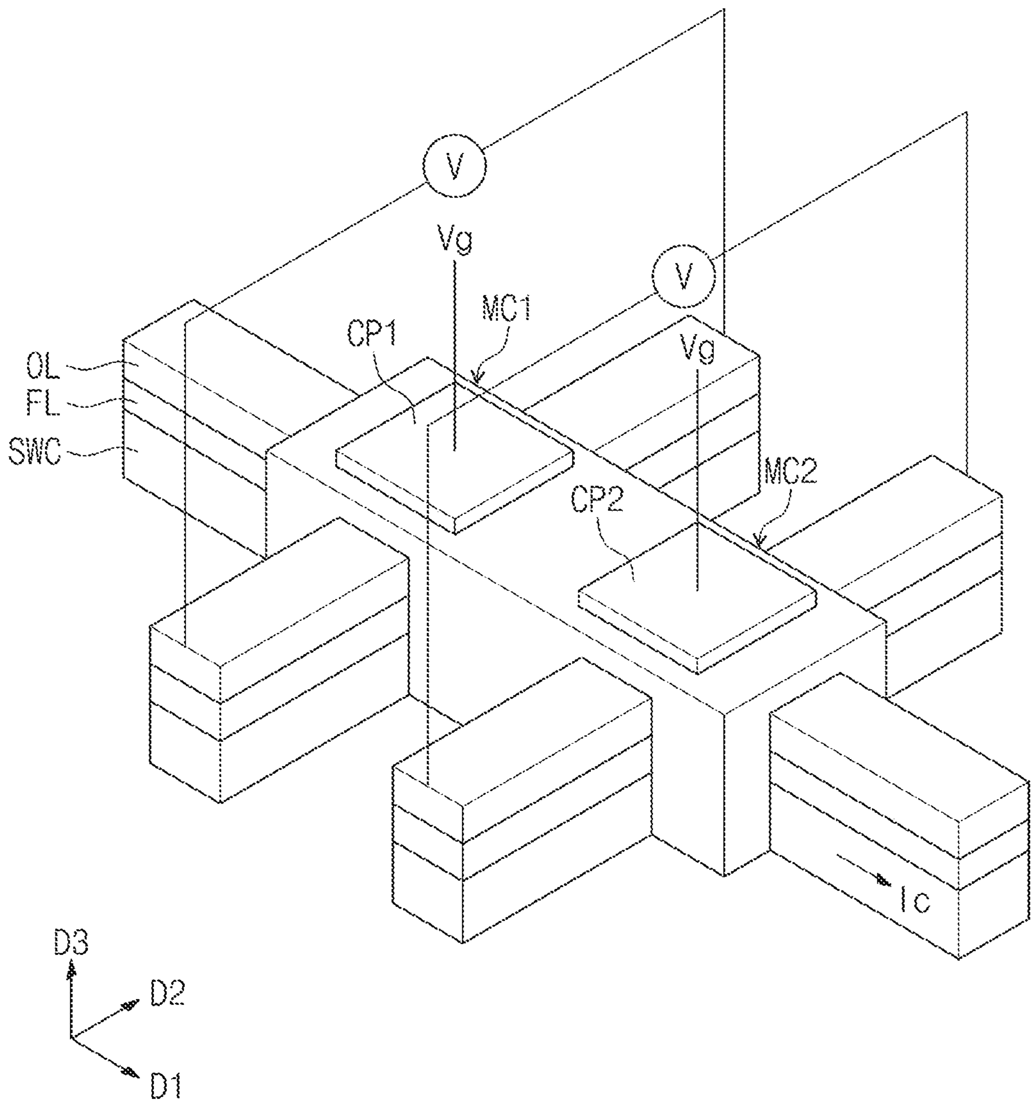
FIG. 9 is a diagram illustrating a multi-bit memory cell in a semiconductor memory device according to some embodiments of the inventive concept.

FIG. 9 is a diagram illustrating a multi-bit memory cell in a semiconductor memory device according to some embodiments of the inventive concept. The semiconductor memory device shown in FIG. 9 may be configured to have a Hall-bar consisting multi-bit cell structure. The Hall-bar structure of FIG. 9 may be used to evaluate a spin state of the free layer FL, without using an MTJ.

Referring to FIG. 9, a semiconductor memory device may further include gate electrodes CP1 and CP2, in addition to the SOC channel layer SWC, the free layer FL, the oxygen reservoir layer OL.

To measure electric characteristics of the memory cells MC1 and MC2, the memory cells MC1 and MC2 may be fabricated using a photolithography process. The memory cells MC1 and MC2 may be fabricated to have a Hall bar structure whose width and length are about 5 μm and about 35 μm, respectively.

The Hall bar structure may be used to read data and may be configured such that gate voltages, which are used to control switching directions of the memory cells MC1 and MC2 sharing the SOC channel layer SWC, are applied through elements provided at its top level. Each of the memory cells MC1 and MC2 may require a total of three terminals (i.e., two terminals for the Hall bar structure and one gate terminal), except for a terminal connected to the SOC channel layer SWC.

The memory cells MC1 and MC2 may include the SOC channel layer SWC, the free layer FL, and the oxygen reservoir layer OL, which are sequentially stacked on a substrate (not shown). As an example, the memory cells MC1 and MC2 may include a magnesium oxide layer, a platinum layer, a cobalt layer, and a gadolinium oxide layer, which are sequentially stacked on a substrate (not shown) including silicon and silicon oxide layers. In some embodiments, a platinum layer may be provided as the channel layer SWC, a cobalt layer may be provided as the free layer FL, and a gadolinium oxide layer may be provided as the oxygen reservoir layer OL. The stacked layers may be patterned to have a shape of Hall bar. A gadolinium oxide layer serving as the gate oxide layer may be deposited, and then, a gate electrode conductive layer may be deposited and patterned to form the gate electrodes CP1 and CP2 of the memory cells MC1 and MC2. The gate electrodes CP1 and CP2 may be used to control the memory cells MC1 and MC2, respectively.

After the formation of the Hall-bar-shaped memory cells MC1 and MC2 and the gate electrodes CP1 and CP2, the semiconductor memory device may be annealed at 250° C. for about 1 hour to realize the perpendicular magnetic anisotropy (PMA) property.

Figure 10A:
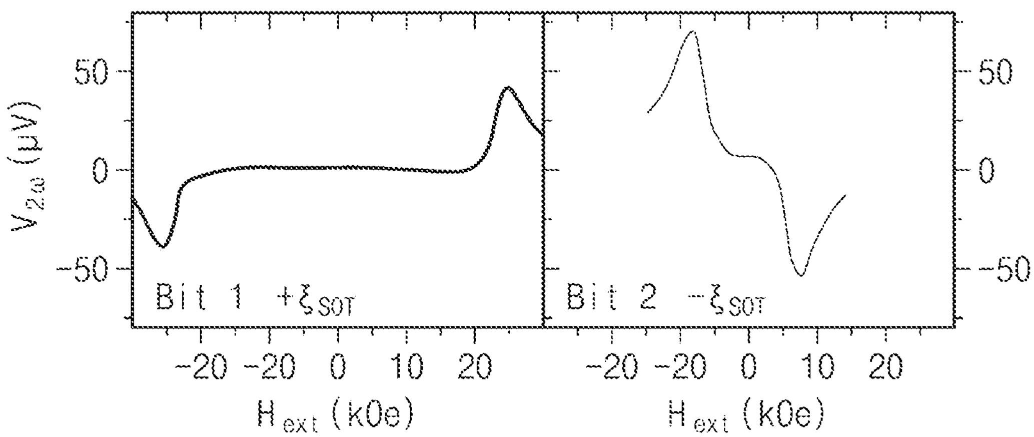
FIGS. 10A and 10B are graphs, which are presented to describe operations on a multi-bit memory cell in a semiconductor memory device according to some embodiments of the inventive concept.
Figure 10B:
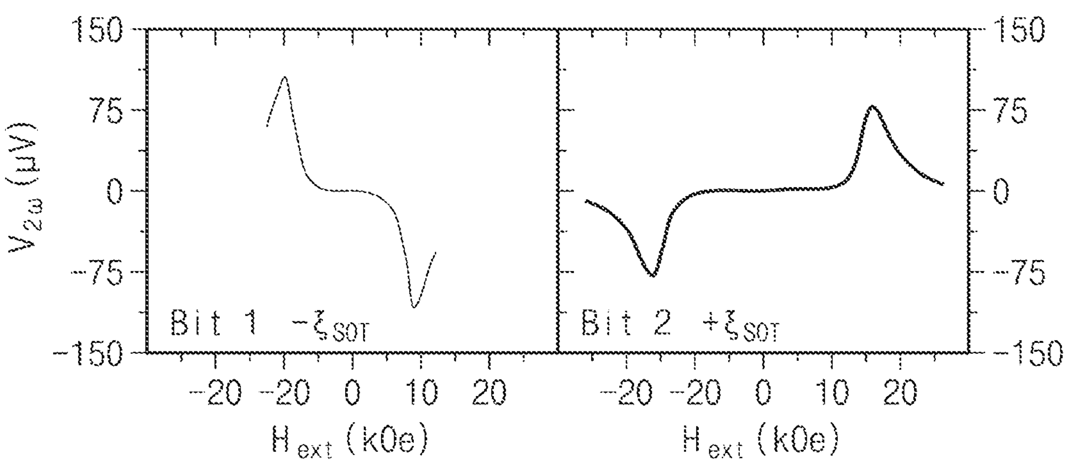

FIGS. 10A and 10B are graphs, which are presented to describe operations on a multi-bit memory cell in a semiconductor memory device according to some embodiments of the inventive concept.

FIGS. 10A and 10B show second-harmonic signals measured from the Hall-bar structure for the multi bit cell shown in FIG. 9 and show a second-harmonic voltage (V2ω) given as a function of an external magnetic field (Hext) for two different programming states of the multi-bit cell structure.

To ascertain that an independent and nonvolatile programming operation is possible for the first and second memory cells MC1 and MC2, a gate voltage Vg of about −2.2V is applied to the second gate electrode CP2 of the Hall bar structure shown in FIG. 9, and as a result, the polarity of SOT efficiency ($\zeta_{SOT}$) is changed to a negative value. The applying of the negative gate voltage Vg may lead to oxidation at the interface between the SOC channel layer SWC and the free layer FL. That is, it may result in the oxidation at the interface of the platinum (Pt) and cobalt (Co) layers. The applying of the negative gate voltage Vg may cause migration of oxygen from the oxygen reservoir layer OL (e.g., a gadolinium oxide layer) to the free layer FL (e.g., a cobalt layer). In addition, the hydrolysis in the underlying SOC channel layer SWC (e.g., a platinum layer) may lead to migration of oxygen toward the free layer FL (e.g., a cobalt layer).

If the oxidation at the interface between the SOC channel layer SWC (e.g., the platinum layer) and the free layer FL (e.g., the cobalt layer) occurs beyond a certain threshold, the oxidation may result in the reversal of an effective Rashba coefficient (ERC), due to a significant reduction in the majority spin-orbital momentum accumulation on interfacial platinum atoms. The reversed ERC, which induces a negative SOT efficiency (ζSOT<0), may compete with the positive ζSOT induced by the spin Hall effect (SHE). With increasing oxidation at the interface between the SOC channel layer SWC (e.g., the platinum layer) and the free layer FL (e.g., the cobalt layer), the effect of the effective Rashba coefficient (ERC) may become a dominant effect surpassing the spin Hall effect (SHE), and in this case, a net ζSOT of the device may become negative and even larger in magnitude than that of the positive ζSOT. Spin accumulation at the interface between the SOC channel layer SWC (e.g., Pt/Co interface) may be opposite to that of a normal Pt-based SOT device. On the other hand, the application of a positive Vg removes oxygen from the Pt/Co interface, leading to a positive SOT polarity i.e., normal Pt-like behavior, as shown in FIG. 4B.

After modifying the SOT polarity of the second memory cell MC2 by the application of the gate voltage Vg to the second gate electrode CP2, a state of each of the memory cells MC1 and MC2 may be evaluated by using the second-harmonic technique at 200 K.

Second-harmonic peaks of the memory cells MC1 and MC2 may have opposite polarity signs, and this may signify that the second memory cell MC2 has a reversed SOT ($-\zeta_{SOT}$) while the first memory cell MC1 has a positive SOT sign (+ζ). Effectively, this may show that different memory cells MC1 and MC2 on a single SOC channel layer SWC are programmed with different SOT polarities. Due to the application of the gate voltage Vg, the SOC channel layer SWC (i.e., platinum layer) below the second memory cell MC2 may serve as a material with a negative spin Hall angle, substantially similar to Ta or W.

To modify the SOT polarities of the memory cells MC1 and MC2, the gate voltage Vg of 2.2V may be applied to the second gate electrode CP2 of the second memory cell MC2 to move the oxygen ions from the interface between the SOC channel layer SWC (i.e., platinum layer) and the free layer FL (i.e., cobalt layer) back into the oxygen reservoir layer OL (i.e., gadolinium oxide layer). At the same time, the gate voltage Vg may be applied to the first gate electrode CP1 of the first memory cell MC1 to oxidize the interface between the SOC channel layer SWC (i.e., platinum layer) and the free layer FL (i.e., cobalt layer) thereunder. The second-harmonic measurements performed on the alternative device state, as shown in FIG. 10B, may reveal that the polarity of the signal reverses for the first and second memory cells MC1 and MC2.

Now, the second memory cell MC2 may have a positive SOT polarity, whereas the first memory cell MC1 may have a negative SOT polarity. That is, the first and second memory cells MC1 and MC2 may be independently programmed to have a positive SOT polarity or a negative SOT polarity.

Since the speed and efficiency of the oxygen migration in each of the memory cells MC1 and MC2 relies on nature and thickness of the oxygen reservoir layer (e.g., the gadolinium oxide layer), an elevated temperature and longer dwell time may be required to facilitate faster oxygen migration. Here, to change the semiconductor memory device according to some embodiments of the inventive concept to the normal state (+ζ) to the reversed state ($-\zeta_{SOT}$), the gate voltage Vg of −2.2V may be applied at 80° C. for 1000-1200 seconds, and to change the state of the device from the reversed state to the normal state, the gate voltage Vg of +2.2 V may be applied at 80° C. for 1000-1200 seconds.

Figure 11:
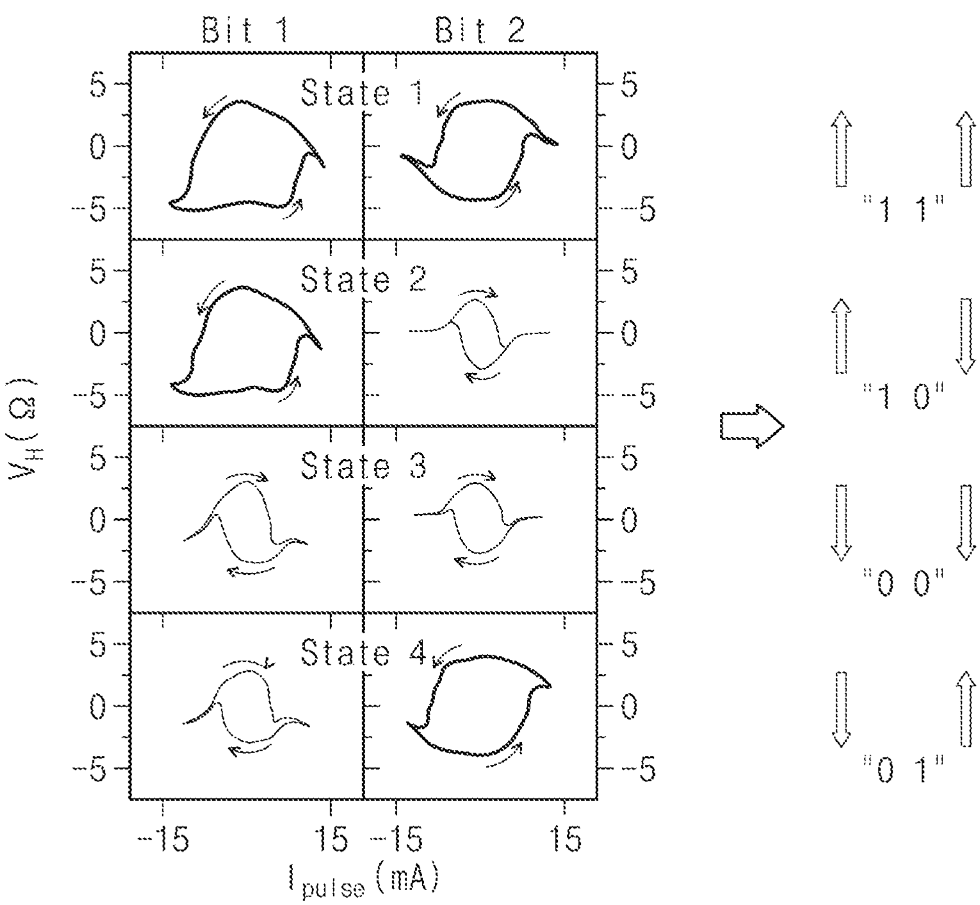
FIG. 11 is a graph, which is presented to describe operations on a multi-bit memory cell in a semiconductor memory device according to some embodiments of the inventive concept.

FIG. 11 is a graph, which is presented to describe operations on a multi-bit memory cell in a semiconductor memory device according to some embodiments of the inventive concept.

FIG. 11 illustrates current-induced magnetization switching loops for various multi-bit program states. A memory cell programmed with positive ζSOT has a counterclockwise switching loop, while a memory cell programmed with negative ζSOT has a clockwise switching loop.

Current-induced switching measurements may be performed on the semiconductor memory device shown in FIG. 9. The current-induced switching measurements may be performed to demonstrate the ability to write all combinations of binary information into a multi-bit cell. For this, the cell may be programmed in four distinct states. Switching loops may be first measured in the virgin state of the device before applying any gate voltage.

For the switching measurement, a pulsed DC current Ipulse may be passed through the device channel in the presence of an in-plane assist field (Hassist), as shown in FIG. 11. Measurements may be performed at 200 K.

Referring to first and second memory cells (Bit-1 and Bit-2) shown in FIG. 11, a switching loop polarity for undisturbed devices may be similar (counterclockwise) and may be the same as that of any Pt-based SOT device (State 1). A current pulse of positive polarity may result in switching the magnetization to the up direction for the two memory cells. This may be equivalent to writing the digital data “11” in the multi-bit arrangement.

In the next step, a negative gate voltage may be applied to the second memory cell (Bit-2) to program the second memory cell (Bit-2) with a negative SOT polarity (−ζSOT). Current-induced switching measurements performed thereafter show that the switching polarity direction for the second memory cell (Bit-2) is now opposite (clockwise) to that of the first memory cell (Bit-1), as shown in State 2 of FIG. 11. Therefore, a positive current pulse may switch the magnetization of the first and second memory cells (Bit-1 and Bit-2) in the up and down directions, respectively, writing the data “10” in the multi-bit memory.

The SOT polarity of the first memory cell (Bit-1) may be toggled by applying the gate voltage Vg thereto. In State 3, both of the first and second memory cells (Bit-1 and Bit-2) may have a negative SOT polarity (−ζSOT). This may result in a clockwise current-induced switching loop for both of the first and second memory cells (Bit-1 and Bit-2). As a result, a positive current pulse may switch the magnetization directions of the two memory cells (Bit-1 and Bit-2) to the down state. Accordingly, it may be possible to write data “00” in the multi-bit memory, without changing the direction of the write current.

The second memory cell (Bit-2) may be reversed to the normal state of positive SOT polarity (i.e., $\zeta_{SOT}>0$) by applying the gate voltage Vg. The current-induced switching loops obtained may be opposite for the two bits, as shown in State 4 of FIG. 11. A positive current pulse may switch the magnetization direction of the first memory cell (Bit-1) to the down state, while the magnetization direction of the second memory cell (Bit-2) is switched to the up state, writing data "01" in the multi-bit memory.

In a semiconductor memory device according to some embodiments of the inventive concept, memory cells in each row of a memory cell array may be configured to share a spin-orbit torque (SOT) channel layer, and a data programming operation may be selectively performed on each of the memory cells. Accordingly, it may be possible to reduce the number of access transistors, which are connected to the SOT-based memory cell, and thereby to increase an integration density of the semiconductor memory device.

While example embodiments of the inventive concept have been particularly shown and described, it will be understood by one of ordinary skill in the art that variations in form and detail may be made therein without departing from the spirit and scope of the attached claims.

What is claimed is:

1. A semiconductor memory device, comprising:

data storage patterns having respective first sides and respective second sides;

a spin-orbit coupling (SOC) channel layer in common contact with the first sides of the data storage patterns, wherein the SOC channel layer is configured to provide a spin-orbit torque to the data storage patterns;

read access transistors connected between the second sides of respective ones of the data storage patterns and respective data lines;

a write access transistor connected between a first end of the SOC channel layer and a source line; and a bit line connected to a second end of the SOC channel layer, wherein each of the data storage patterns comprises a free layer in contact with the SOC channel layer and an oxygen reservoir layer in contact with the free layer.

2. The semiconductor memory device of claim 1, wherein the oxygen reservoir layer comprises a rare-earth element.

3. The semiconductor memory device of claim 1, wherein the oxygen reservoir layer comprises a gadolinium oxide (GdOx) layer.

4. The semiconductor memory device of claim 1, wherein a thickness of the oxygen reservoir layer is greater than a thickness of the SOC channel layer or a thickness of the free layer.

5. The semiconductor memory device of claim 1, wherein the oxygen reservoir layer is between a fixed layer and the free layer, and wherein the oxygen reservoir layer is spaced apart from the SOC channel layer.

6. The semiconductor memory device of claim 1, wherein each of the data storage patterns further comprises a fixed layer on the oxygen reservoir layer.

7. The semiconductor memory device of claim 6, wherein each of the data storage patterns further comprises a first tunnel magnetoresistance (TMR) enhancement layer between the free layer and the oxygen reservoir layer.

8. The semiconductor memory device of claim 7, wherein each of the data storage patterns further comprises a second TMR enhancement layer between the oxygen reservoir layer and the fixed layer.

9. The semiconductor memory device of claim 1, wherein the oxygen reservoir layer comprises an oxide material configured to cause migration of an oxygen ion when a voltage is applied thereto.

10. The semiconductor memory device of claim 1, wherein each of the data storage patterns is configured such that an amount of oxygen in an interface region between the free layer and the SOC channel layer is adjusted by a voltage applied thereto.

* * * * *